United States Patent [19]

Arney et al.

[11] Patent Number: 4,533,615
[45] Date of Patent: Aug. 6, 1985

[54] ABRASION DEVELOPMENT

[75] Inventors: Jonathan S. Arney; Richard F. Wright, both of Chillicothe, Ohio

[73] Assignee: The Mead Corporation, Dayton, Ohio

[21] Appl. No.: 665,895

[22] Filed: Oct. 29, 1984

Related U.S. Application Data

[60] Continuation-in-part of Ser. No. 554,813, Nov. 23, 1983, abandoned, which is a division of Ser. No. 397,681, Jul. 13, 1982, Pat. No. 4,448,516.

[51] Int. Cl.³ .......................... G03C 1/68; G03C 5/24
[52] U.S. Cl. .................................. 430/138; 430/403; 346/201
[58] Field of Search ................. 430/138, 403; 346/201

[56] References Cited

U.S. PATENT DOCUMENTS 3,700,439 10/1972 Phillips .............................. 430/138
4,399,209 8/1983 Sanders ............................. 430/138
4,440,846 4/1984 Sanders ............................. 430/138
4,448,516 5/1984 Arney et al. ........................ 355/27

Primary Examiner—Richard L. Schilling
Attorney, Agent, or Firm—Biebel, French & Nauman

[57] ABSTRACT

This invention relates to image developing apparatus and specifically a developer roll for use in combination with a color producing substrate. In accordance with this invention, a color is formed by the reaction of isolated chromogenic materials. A first chromogenic material is typically a color precursor of the electron donating type and is encapsulated with a photosensitive composition on the surface of an imaging sheet. The second chromogenic material is typically identified as a color developer and is generally of the electron accepting type. In this invention the active coating on the imaging sheet is abraded to rupture the capsules and promote the reaction of the color forming ingredients.

7 Claims, 9 Drawing Figures

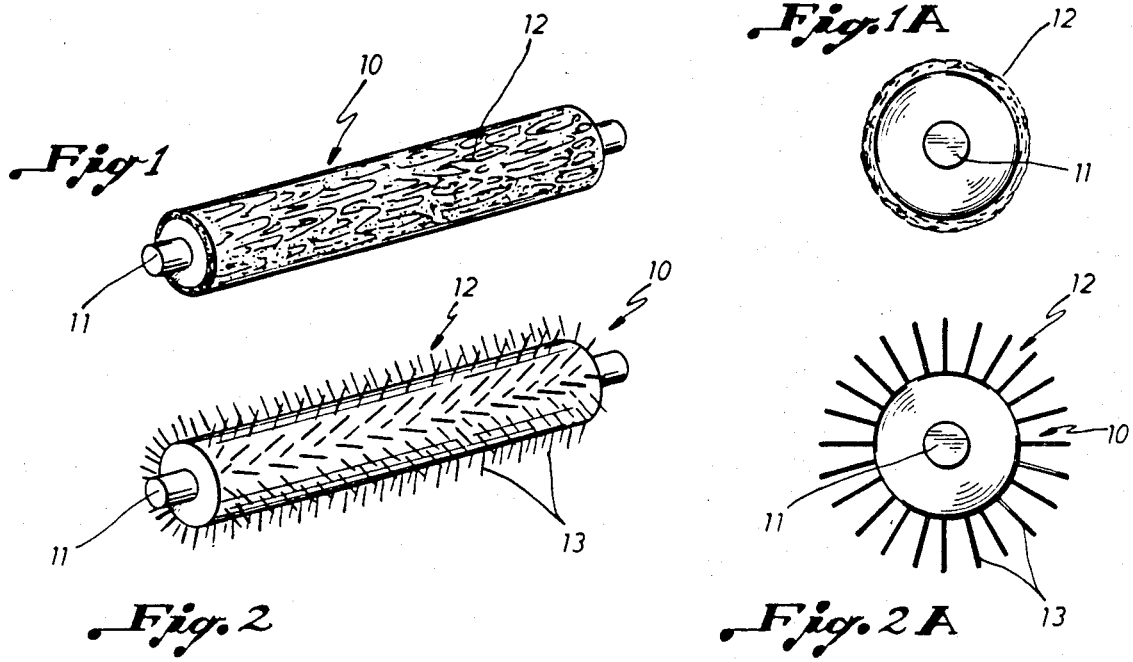
Fig. 1
Fig. 1A
Fig. 2
Fig. 2A
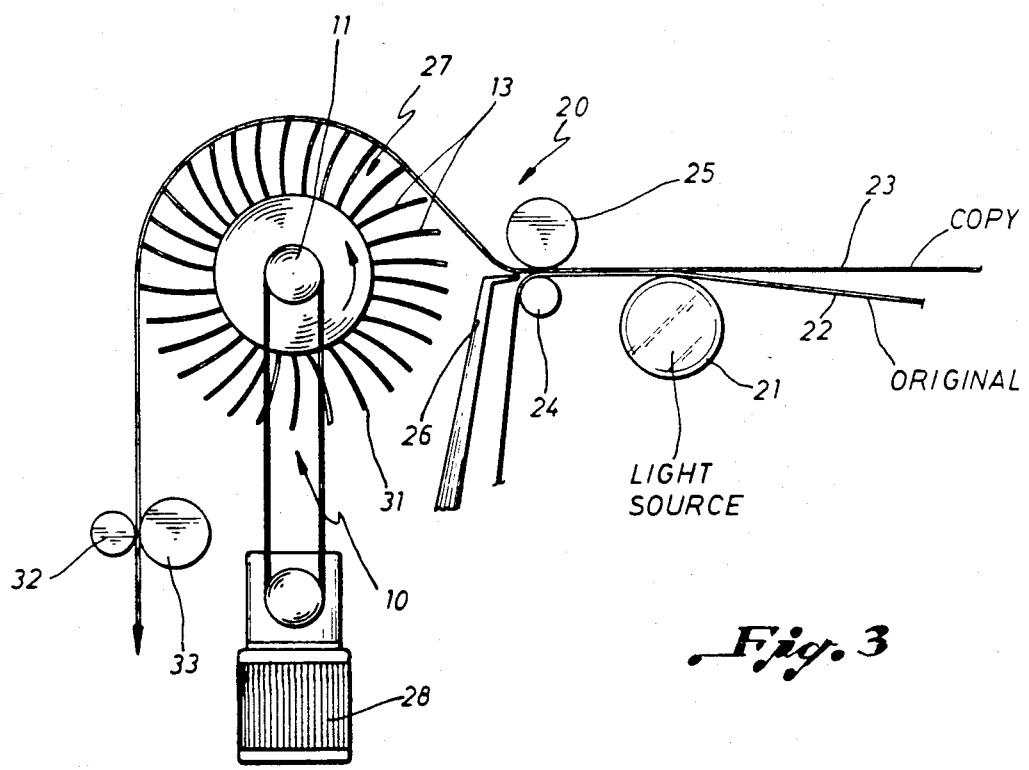
Fig. 3

ABRASION DEVELOPMENT

CROSS-REFERENCE TO RELATED APPLICATIONS

This application is a continuation-in-part of U.S. application Ser. No. 554,813, filed Nov. 23, 1983, now abandoned, which in turn is a division of U.S. application Ser. No. 397,681, filed July 13, 1982, now U.S. Pat. No. 4,448,516.

BACKGROUND OF THE INVENTION

The instant invention relates to a method for developing a latent image. U.S. Pat. Nos. 4,440,846 and 4,399,209 to The Mead Corporation describe an imaging system wherein a photosensitive layer comprising microcapsules containing a photosensitive composition in the internal phase is image-wise exposed to actinic radiation and subjected to a uniform rupturing force whereupon the microcapsules rupture and image-wise release the internal phase. An image-forming agent such as a substantially colorless color former is typically associated with the microcapsules such that when the microcapsules rupture the color former is able to image-wise react with a developer material and produce a color image. In the embodiments described in the aforementioned patents, the uniform rupturing force is pressure and the capsules are ruptured by passing the image-wise exposed sheet through the nip between a pair of pressure rollers. A comparatively large caldender nip is required for this purpose in order to establish a uniform linear pressure across the surface of the imaging sheet. As a general rule, as the width of the imaging sheet doubles, the diameter of the pressure rollers must cube to achieve uniform linear pressure and development.

In accordance with this invention latent images produced by image-wise exposure of the aforementioned sheet are developed by abrasion as contrasted with pressure. In accordance with a particular embodiment of the invention, a developer roll abrades the active coating on the color producing substrate to promote the reaction of the color forming ingredients.

DEFINITIONS

The term "abrasion" is used herein to mean that, as distinguished from pressure, the microcapsules are ruptured through a frictional or shearing action.

The term "microcapsule" as used herein refers to both microcapsules having a discrete capsule wall and microcapsules formed in a so-called open phase system wherein the internal phase constituents are simply dispersed in a binder.

SUMMARY OF THE INVENTION

A principle object of the present invention is to provide a development mode which does not rely on pressure or large calender rollers for the development of color between co-reactive components.

Another object of the present invention is to provide an inexpensive and lightweight development system which is adaptable to use in small photocopiers and other apparatus wherein convenience, size and weight are of paramount importance.

Still another object of the instant invention is a safe development apparatus which does not require pressure nips.

A more specific object of the present invention is to provide a developer apparatus for use with self-contained photosensitive papers.

These and other objects are attained in the present invention in which its preferred embodiment relates to a method for developing a latent image in a photosensitive layer of microcapsules containing a photosensitive composition in the internal phase which comprises subjecting the photosensitive layer to uniform abrasion such that the microcapsules rupture and image-wise release the internal phase.

In accordance with the present invention it has been found that a comparatively small abrasion force is all that is required to develop latent images in the aforementioned imaging system and that the large rollers which are conventionally use to effect pressure development can be replaced with more compact abrasion means.

In accordance with one embodiment of the present invention, latent images are developed by contact with a developer roller having a fibrous outer surface.

BRIEF DESCRIPTION OF THE DRAWINGS

FIG. 1 is a developer roll in accordance with one embodiment of this invention;

FIG. 2 is a developer roll in accordance with a second embodiment of this invention;

FIG. 2A is a cross-sectional view taken along the line 2A—2A in FIG. 2;

FIG. 3 is a schematic of a positive working diazo process utilizing the developer roll of this invention;

DETAILED DESCRIPTION OF THE INVENTION

Figure 4:
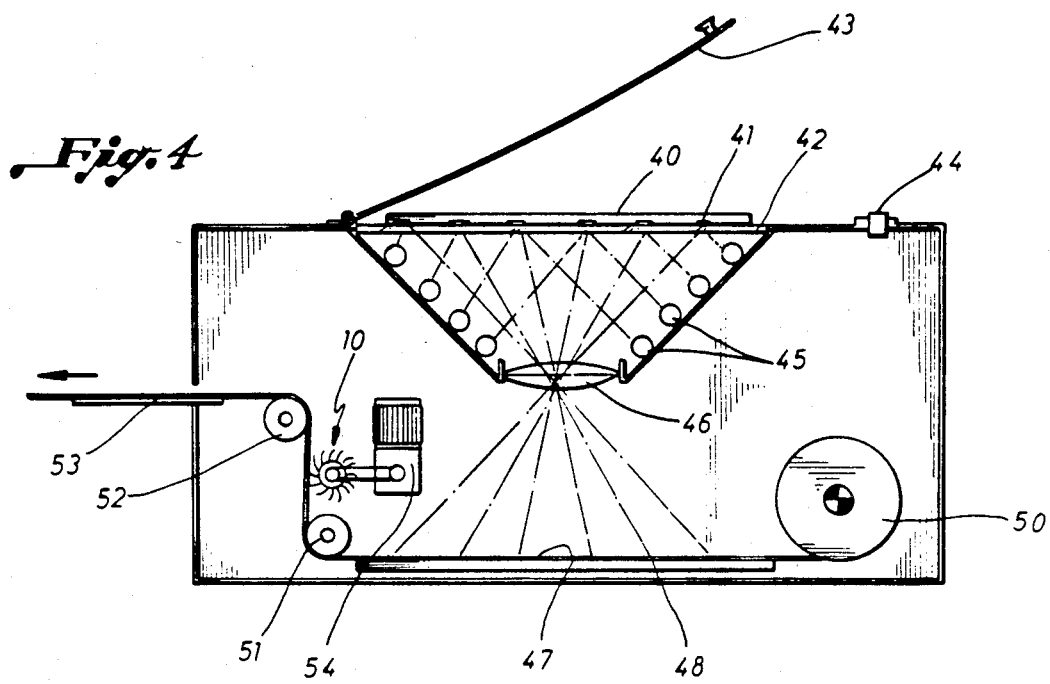
FIG. 4 is a schematic of a positive working photocopying apparatus using the developer roll of this invention.

The imaging sheets exposed and developed in accordance with the present invention are described in U.S. Pat. Nos. 4,399,209 and 4,440,846, both of which are incorporated herein by reference.

For the purposes of promoting an understanding of the principles of this invention, reference will now be made to the embodiments illustrated in the drawings and specific claims will be used to described the same. It will nevertheless be understood that no limitation of the scope of the invention is thereby intended, such alterations and further modifications in the illustrated device, and such further application of the principles of the invention as illustrated therein contemplated as would normally occur to one skilled in the art to which the invention relates.

FIG. 1 illustrates a developer roll in accordance with one embodiment of this invention. In FIG. 1 the developer roll 10 is shown as comprising a mandrel 11 and an outer fibrous surface 12. Outer fibrous surface 12 is composed of interwoven fibers of natural or synthetic material. A common example of a developer roll such as this is the commonly available replaceable paint roller. These rollers as well as other rollers which are useful in the invention typically consist of matted fibers or other flexible material. A felt outer surface can also be used. The term "fibrous outer surface" is used herein to generically refer to the outer surface of these rollers.

FIG. 1A shows a cross-sectional area of developer roll 10 of FIG. 1, but shows in more detail fibrous outer surface 12. Mandrel 11 is intended to provide the rotational basis for the developer 10. Mandrel 11 may consist of one or more parts which may be variously sized depending upon speeds and equipment which are used in the developing process.

A second type of developer roll useful in this invention is illustrated by FIGS. 2 and 2a. In FIG. 2 the developer roll 10 includes a mandrel 11 as well as a fibrous outer surface 12. However, in FIG. 2 the fibrous outer surface 12 consists of a plurality of flexible bristles 13.

FIG. 2A shows in cross-section the embodiment of FIG. 2. Illustrated more clearly are the mandrel 11, fibrous outer surface 12 and flexible bristles 13. It should be understood that the embodiments illustrated by FIGS. 1 and 2 are meant to be merely exemplary of a large variety of surface materials which can be used in the developmental process of this invention.

Although this invention is intended for use with a variety of reactive substrates and in combination with a variety of imaging apparatuses, two examples are provided for purposes of illustration. These examples are provided in FIGS. 3 and 4 and relate generally to a positive working diazo system and a positive working photocopying system, respectively. These examples are provided for purposes of illustration only and are not meant to be limiting in any fashion on the scope or application of the developer roll of this invention.

Reffering now to FIG. 3, a diazo apparatus 20 is ilustrated. The diazo apparatus 20 includes a light source 21 which is positioned to emit light through an original 22 onto a reactive copy sheet 23. The original 22 and reactive copy sheet 23 are then conveyed in abutting relationship through driven roller 24 and guide roller 25. A separating apparatus 26 then separates original 22 from copy 23.

The copy substrate 23 and more particularly the coated surface of substrate 23 is then conveyed around developer roller 27. Roller 27 consists of a driven mandrel 11 which is driven by motor 28. Roller 27 also includes flexible bristles 13. The surface 31 of roller 27 is operated at a speed substantially faster than the traverse speed of the copy paper 23. This provides the abrasive effect which is desired to formulate the color between the co-reacted materials on the reactive surface of copy sheet 23. Copy sheet 23 is then advanced through driven roller 32 and guide roller 33. It should be noted that rollers 25 and 33 exert contact as contrasted with rupturing pressure on the copy sheet. After exiting from rollers 32 and 33, the color and/or image will have been developed or will be in the process of developing. At this point in time, if a continuous roll is being used appropriate cutting or sectioning apparatus can be used to section the roll into sheets. Or, on the other hand, if sheets of the particular substrate are being fed through the apparatus then the sheets can be ejected into appropriate catching apparatus.

Although it has been shown to be essential that the surface speed of the roller be greater than the speed of the paper web or substrate the precise ratio of roller speed to copy paper speed is not critical so long as the desired abrasive effect is achieved. In general, it is felt that a ratio of roller speed to substrate speed of from about 10:1 to about 500:1 is an effective range although a more preferred range would be 10:1 to 100:1 and a most preferred range would be 10:1 to 25:1. It is necessary to achieve a proper balance between speed of the roller to produce the desired reaction and at the same time not cause damage to the substrate.

The variety of combinations of imaging apparatus, light sources, roller drive mechanisms, motors to drive the developer roll, catchers or other finishing apparatus are infinite. The essential portion of this invention is the use of abrasion such as has been described to develop a latent image in the aforementioned imaging sheet without the necessity for the standard pressure rolls, pressure nips and problems associated therewith.

Turning now to FIG. 4, a different apparatus is shown for imaging and developing reactive copy sheets. In FIG. 4 what is referred to as a desk top copier is shown. In this embodiment, an original 40 is placed with the written side 41 adjacent a glass or plastic, transparent, plate 42. A cover 43 is then lowered on top of the original 40.

The copying process is initiated by actuation of switch 44 which activates light sources 45. Light sources 45 emit an appropriate light, such as ultraviolet, which is either selectively absorbed or reflected off of printed surface 41. The reflected light is then passed through an appropriately dimensioned lens 46 and then refocused on active surface 47 of copy sheet 48. Copy sheet 48 can be either in sheet form or in roll form. The roll form is illustrated by number 50 in FIG. 4.

After a predetermined exposure time of active surface 47, the light emitting sources 45 are turned off and the paper is advanced via rollers 51 and 52, either or both of which may be driven, to a catching station 53. Between rollers 51 and 52 is located developer roller 10 which is driven by drive motor or actuating means 54. Drive motor 54 can be any of a variety of well-known electrical or mechanical motors.

Roller 10 is shown in its preferred embodiment which includes a mandrel 11 and a plurality of flexible bristles 13. In this fashion the coating 47 is selectively exposed to actinic radiation emitted from light sources 45. In the preferred embodiment the microcapsules are then selectively activated or deactivated such that upon abrasion by developer roll 10 a color is developed.

Figure 5:
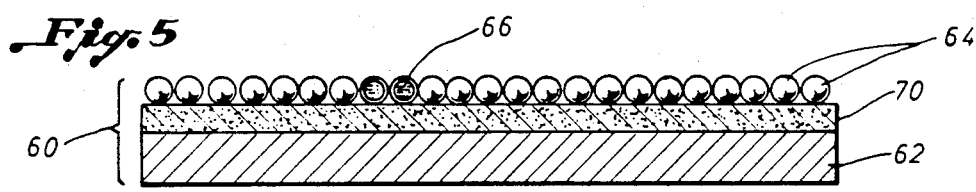
FIG. 5 is a schematic illustration in cross-sectional of a self-contained imaging sheet developable in accordance with this invention.

FIG. 5 illustrates one embodiment of the imaging system/copy paper which is useful in combination with the developer roll of the present invention. In this copy paper a self-contained imaging sheet 60 is shown. The imaging sheet 60 is constituted by a substrate 62 coated with a layer of microcapsules 64. The microcapsules are filled with an internal phase 66 containing a chromogenic material and a photosensitive system. Interposed between a layer of microcapsules 64 and the substrate 62 is a layer of a developer material 70. In actuality, the microcapsules 64 are not visible to the unaided eye.

Figure 6:
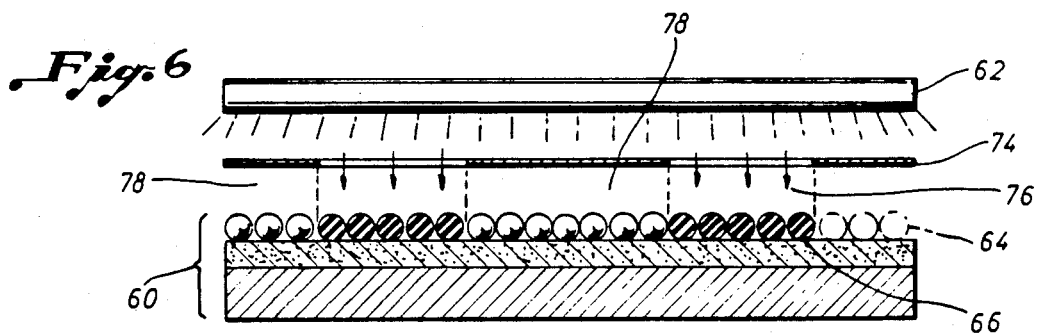
FIG. 6 is a schematic illustration of exposure and development of the imaging sheet of FIG. 5.

Exposure of the imaging sheet 60 by transmission imaging is shown in FIG. 6 wherein a source of radiant energy 62 is positioned above the surface of the imaging sheet 60 with a mask 74 therebetween. In this illustration the photosensitive material is designated a resin curable mterial and, hence, the imaging sheet is positive working. Exposure is shown as solidifying the internal phase 66 in the exposed area 76 whereas the internal phase 66 remains liquid in the unexposed area 78. Transmission imaging has been selected to illustrate the invention system operation for the ease with which it can be illustrated. An equally common exposure means is reflection imaging which is used in copying printed documents.

Figure 7:
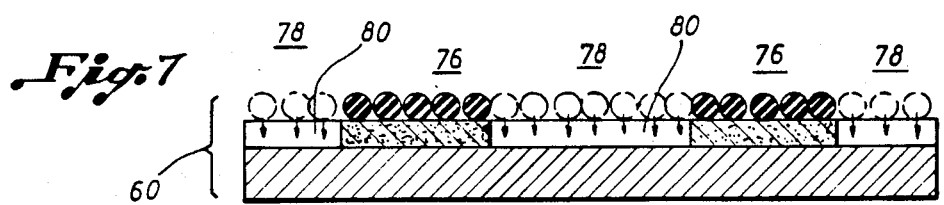
FIG. 7 is a schematic illustration of the developed sheet of FIG. 6.

FIG. 7 illustrates the imaging sheet 60 after the microcapsules have been ruptured. For simplification, the microcapsules are shown as being ruptured in the unexposed area 78 and unruptured in the exposed area 76. In actuality, all or a portion of the capsules may also be ruptured in area 76. In unexposed area 78 the chromogenic material and the developer react to form a visible image 80. FIGS. 5, 6 and 7 represent but one embodiment of the color producing substrate which is useful in combination with the developer roll of this invention.

Although several embodiments have been illustrated it should be understood that many other commercially useful embodiments are contemplated as coming within the scope of this invention. In one such embodiment a plurality of developer rollers would be used instead of the single roller illustrated by the drawing. In another embodiment heat means would be supplied to act in combination with the abrasive roller. The heat supplied by this separate heat means could be in addition to the heat which is typically produced as a by-product of the friction between the developer roller and the reactive substrate. Other abrasion means that are also useful in developing latent images by rupturing microcapsules include magentic brushes of the type commonly used to apply toner in xerographic systems.

While the invention has been illustrated and described in detail in the drawings in the foregoing description, the same is to be considered as illustrative and not restrictive in character, it being understood that only the preferred embodiment has been shown and described and that all changes and modifications that come within the spirit of the invention are desired to be protected.

What is claimed is:

1. A method for developing a latent image in an imaging sheet having a photosensitive layer and a layer of a color developer, said photosensitive layer including microcapsules containing a photosensitive composition and a chromgenic material in the internal phase, comprising uniformly abrading said photosensitive layer such that said microcapsules rupture and image-wise release said internal phase.

2. The method of claim 1 wherein said chromogenic material is a substantially colorless electron donating color former.

3. The method of claim 2 wherein said microcapsules have a discrete capsule wall.

4. The method of claim 3 wherein said layer is abraded by contacting said layer with a rotating developer roll having a fibrous outer surface.

5. The method of claim 4 wherein said layer is sequentially contacted with a plurality of said developer rolls.

6. The method of claim 4 wherein said rotating developer roller has a tangential velocity which is greater than the velocity of said imaging sheet.

7. A method for developing a patterned image on a photosensitive substrate comprising the steps of: image-wise exposing a photosensitive substrate to actinic radiation, said substrate being coated with a photosensitive layer and a color developer, said photosensitive layer including microcapsules containing a photosensitive composition and a chromgenic material, said developer being co-reactive with said chromogenic material to form a color; releasing said chromogenic material from said microcapsules by abrading said photosensitive layer with a developer roll.

* * * * *